(12) United States Patent
Shen et al.

(10) Patent No.: US 11,092,311 B2
(45) Date of Patent: Aug. 17, 2021

(54) LIGHT EXTRACTION BRIDGE IN CUPS

(71) Applicant: Lumileds LLC, San Jose, CA (US)

(72) Inventors: Yu-Chen Shen, San Jose, CA (US); Oleg B. Shchekin, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/815,706

(22) Filed: Mar. 11, 2020

(65) Prior Publication Data
US 2020/0292149 A1    Sep. 17, 2020

Related U.S. Application Data

(60) Provisional application No. 62/816,541, filed on Mar. 11, 2019.

(51) Int. Cl.
| | |
|---|---|
| *F21V 7/06* | (2006.01) |
| *F21V 7/28* | (2018.01) |
| *F21V 7/09* | (2006.01) |
| *F21V 7/24* | (2018.01) |
| *F21Y 115/10* | (2016.01) |

(52) U.S. Cl.
CPC ............... *F21V 7/06* (2013.01); *F21V 7/09* (2013.01); *F21V 7/24* (2018.02); *F21V 7/28* (2018.02); *F21Y 2115/10* (2016.08)

(58) Field of Classification Search
CPC ..... F21V 7/06; F21V 7/09; F21V 7/24; F21V 7/28
See application file for complete search history.

(56) References Cited

U.S. PATENT DOCUMENTS

| | | | |
|---|---|---|---|
| 6,382,803 B1 * | 5/2002 | Arumugasaamy | ...... F21V 7/048 359/850 |
| 9,543,486 B1 | 1/2017 | Lin et al. | |
| 10,439,113 B2 * | 10/2019 | Sano | ........................ H01L 33/60 |
| 10,749,088 B2 * | 8/2020 | Sano | ...................... H01L 33/507 |
| 2003/0165061 A1 * | 9/2003 | Martineau | ................. F21V 7/09 362/297 |
| 2003/0230751 A1 | 12/2003 | Harada | |

(Continued)

FOREIGN PATENT DOCUMENTS

| | | |
|---|---|---|
| EP | 1919002 A1 | 5/2008 |
| TW | 201324871 A | 6/2013 |

OTHER PUBLICATIONS

"International Application Serial No. PCT/US2020/022055, International Search Report dated Jun. 9, 2020", 5 pgs.

(Continued)

*Primary Examiner* — William N Harris
(74) *Attorney, Agent, or Firm* — Schwegman Lundberg & Woessner, P.A.

(57) ABSTRACT

A light emitting device may comprise a cup having a wall extending from a first area of the cup to a second area of the cup. The wall is formed from or coated with a reflective material. The light emitting device may comprise a light extraction bridge extending beyond an outer diameter of at least a portion of the wall for directing light into the air. The light may be produced by an LED die mounted at the second area of the cup such that at least some of a light emitted from the LED die exits the cup, having been reflected from the wall and the light extraction bridge.

23 Claims, 13 Drawing Sheets

(56) References Cited

U.S. PATENT DOCUMENTS

| | | | |
|---|---|---|---|
| 2005/0253153 A1* | 11/2005 | Harada | H01L 33/644 |
| | | | 257/79 |
| 2006/0076568 A1 | 4/2006 | Keller et al. | |
| 2007/0267637 A1 | 11/2007 | Kim et al. | |
| 2010/0078663 A1 | 4/2010 | Shi et al. | |
| 2013/0077332 A1* | 3/2013 | Hessling | F21V 13/02 |
| | | | 362/470 |
| 2014/0175482 A1 | 6/2014 | Jang et al. | |
| 2016/0245482 A1* | 8/2016 | Shimoda | F21V 7/08 |

OTHER PUBLICATIONS

"International Application Serial No. PCT/US2020/022055, Written Opinion dated Jun. 9, 2020", 7 pgs.

"European Patent Application Serial No. 19167369.8, European Search Report dated Sep. 12, 2019", 8 pgs.

* cited by examiner

LIGHT EXTRACTION BRIDGE IN CUPS

This application claims the benefit of priority to U.S. Patent Application Ser. No. 62/816,541, filed Mar. 11, 2019 and EP Patent Application Serial No. 19167369.8, filed Apr. 4, 2019, each of which is incorporated herein by reference in its entirety.

BACKGROUND

The primary optic 208 may be on or over one or more layers of the LED device 200 and allow light to pass from the active layer 204 and/or the wavelength converting layer 206 through the primary optic 208. The primary optic 208 may be a lens or encapsulant configured to protect the one or more layers and to, at least in part, shape the output of the LED device 200. Primary optic 208 may include transparent and/or semi-transparent material. In example embodiments, light via the primary optic may be emitted based on a Lambertian distribution pattern. It will be understood that one or more properties of the primary optic 208 may be modified to produce a light distribution pattern that is different than the Lambertian distribution pattern. As disclosed herein, primary optic 208 may not be included in one or more embodiments disclosed herein.

SUMMARY

A light emitting device may comprise a cup having a wall extending from a first area of the cup to a second area of the cup. The wall is formed from or coated with a reflective material. The light emitting device may comprise a light extraction bridge extending beyond an outer diameter of at least a portion of the wall, for directing light into the air. The light may be produced by an LED die mounted at the second area of the cup such that at least some of a light emitted from the LED die exits the cup, having been reflected from the wall and the light extraction bridge.

DETAILED DESCRIPTION

Figure 1A:
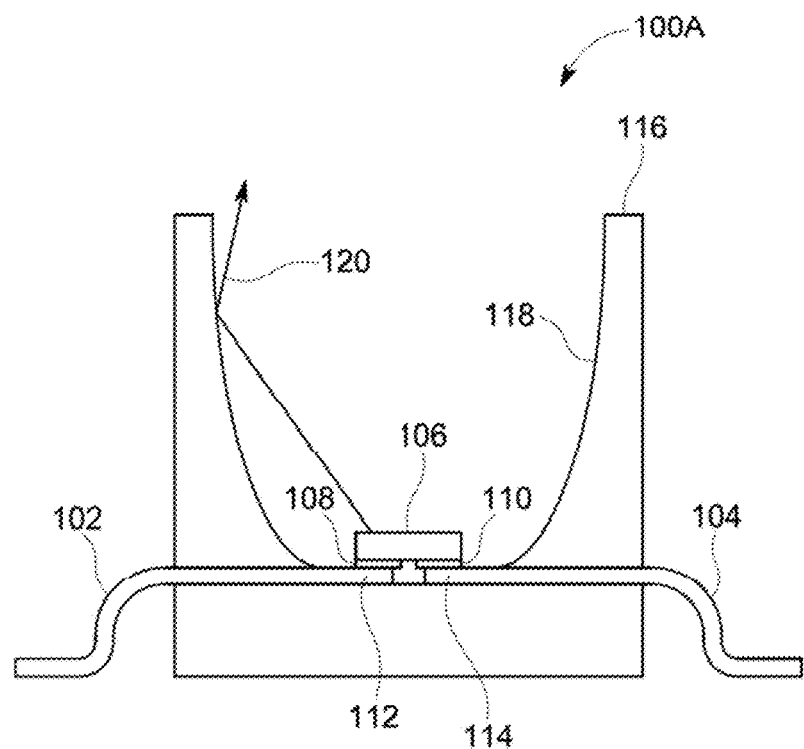
FIG. 1A is a diagram of a reflective cup package.

Examples of different light illumination systems and/or light emitting diode implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Semiconductor light emitting devices or optical power emitting devices, such as devices that emit ultraviolet (UV) or infrared (IR) optical power, are among the most efficient light sources currently available. These devices may include light emitting diodes, resonant cavity light emitting diodes, vertical cavity laser diodes, edge emitting lasers, or the like (hereinafter referred to as "LEDs"). Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi junction devices or arrays of LEDs (such as monolithic LED arrays, micro LED arrays, etc.) may be used for applications where more brightness is desired or required.

FIG. 1A is a diagram of a reflective cup package 100A. A copper lead frame is stamped from a sheet or sheets to form the leads 102 and 104 of the package 100A. The area where the leads 102 and 104 are to be bonded to the LED die 106 electrodes 108 and 110 may be plated with a suitable metal, such as gold or another alloy or alloys, to form bonding pads 112 and 114. Gold balls, solder wetting, or other techniques, if required, may also be used to allow bonding to the die electrodes 108, 110. Any portion of the lead frame that is used for an electrical connection is referred to herein as a bonding pad or an electrode, whether the connection is by solder, ultrasonic weld, wire bond, conductive epoxy, etc.

Over the lead frame is molded cup such as plastic cup 116. It will be understood that the molded cup may be plastic, another material, and/or a blend such a plastic and metal blend as discussed further herein. Compression molding or injection molding may be used to mold the cup 116. Preferably, the plastic is thermally conductive. If the plastic is also electrically conductive, for example, due to containing metal particles (for increasing its thermal conductivity), the portion of the lead frame in contact with the plastic has a dielectric coating (not separately shown) formed over it prior to the molding step.

The cup 116 generally forms a parabola which is orthogonal, relative to its opening direction, to the plane of the top light emitting surface of LED 106, with a circular cross-section which is parallel to the plane of the top light emitting surface of LED 106. The surface of the cup 116 facing away from the opening (e.g, the base of the cup) is a generally flat surface. The shape can also be a compound parabolic concentrator (CPC). In one embodiment, the parabola portion of the cup 116 is about 5 mm deep, its top opening is about 6-7 mm in diameter, and its bottom surface flat area for the LED die 106 is about 1-2 mm in diameter. The cup 116 slopes up from its bottom surface to its top edge to generally reflect all LED die light upward. The deeper the cup, the narrower the beam, so the beam shape can be determined by the cup shape rather than any lens. In an embodiment, no lens is used.

The cup 116 may be composed of a reflective scatterr such that light incident upon the surface of the cup 116 may scatter in multiple directions. Alternatively or in addition, the inside surface of the cup 116 may be coated with a reflective material 118, such as a silver or aluminum film, by sputtering, evaporation, spraying or other process. The reflection based on the material and/or based on the reflective material 118 may be specular for the narrowest beam or may be diffusive (such as by using white paint) for a wider beam. A masking process may be used to ensure that that bonding pads 112, 114 are not shorted or coated by reflective material 118. In the alternative, the reflective material may be removed from bonding pad 112, 114 and then plated with gold or any other suitable material.

The bottom electrodes 108, 110 of the flip-chip LED die 106 are bonded to the bonding pads 112, 114 formed at the ends of the leads 102 and 104. The bonding may be by ultrasonic welding, solder, solder paste, conductive epoxy, or by other means. LED dies are typically square and on the order of 0.5-1 mm per side. The leads 102 and 104 form anode and cathode leads for connection to a power supply.

Depending on the application, the outer ends of the leads 102 and 104 may be soldered to metal pads on a printed circuit board (PCB) or other substrate to supply power to the LED die 106. A light ray 120 emitted from the LED die 106 is shown reflecting off the wall of the cup 116 in a forward direction. Light rays from the side walls of the LED die 106 will similarly be reflected upwards by the cup 116. A cup 116 may be described by a certain slope or curvature to the side of the cup.

The cup 116 may include a number of absorbing elements. Absorbing elements may include, but are not limited, to solder, for example used for bonding of die electrodes 108, 110, other wire bonds, submounts including, for example, a PCB and of course the die itself 106. These are located within the cavity of a cup 116 and may absorb some reflected light rays. An example absorbing element is shown by absorbing surface 122 of FIG. 1B.

It should be noted that although a flip chip configuration for LED dies is shown in one or more figures herein (e.g., FIG. 1A), one or more other configures for LED dies may be used in accordance with the subject matter disclosed herein. As a non-limiting example, FIG. 1M shows the reflective cup package 100M which is similar to reflective cup package 100A, but includes an AlInGaP die 106b with wire bonds 115 connecting the die 106b to bonding pads 112 and/or 114. Other configurations of LED dies are also applicable to the subject matter disclosed herein.

Figure 1B:
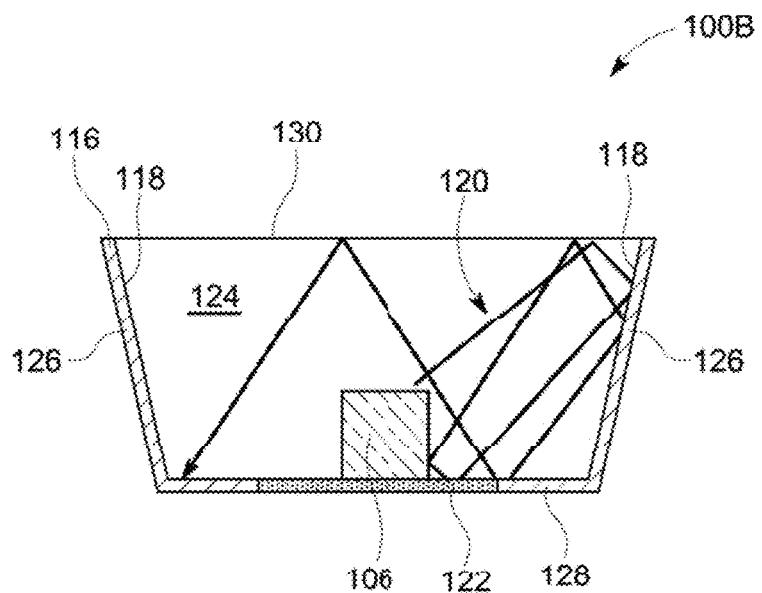
FIG. 1B is a diagram showing a standard cup cavity.

FIG. 1B is a diagram 100B of a cup 116 which illustrates that when light is emitted from an LED die 106, light may scatter around in the cup 116 and hit many of the absorbing surfaces 122 or LED die 106 in the cavity 124 of the cup 116 before escaping into air. Because each one of these surfaces 122 absorb light, less light may then escape thereby reducing brightness and/or reducing efficiency. In FIG. 1B, cup wall 126 is coated with a reflective surface 118, however, some reflections of light ray 120 are still reflected towards the base 128 of the cup 116. Some reflections may come from the light ray 120 reaching an air boundary 130 (or any other material boundary). These reflections may be due in part from different material properties of materials inside the cavity 124 of the cup 116 including reflective coating 118 and the air 130 or other material above.

Figure 1C:
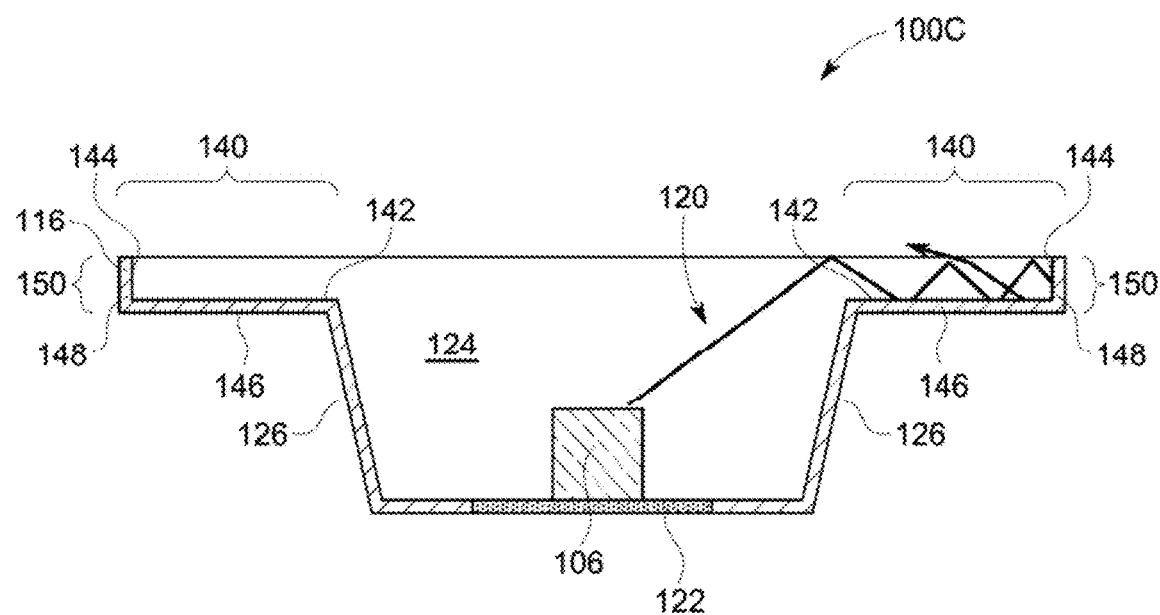
FIG. 1C is a diagram showing a cup cavity with light extraction bridges.

FIG. 1C is a diagram 100C showing a cup 116 having a cavity 124 and a light extraction bridges 140. At the upper portion 150 of the cup 116, a light extraction bridge is formed to aid in directing light ray upwards into the air above. With the light extraction bridge formed into the cup, light ray 120 may enter a light extraction bridge 140 and be reflected back internally, i.e. via a total internal reflection (TIR) phenomenon, among the reflective surfaces 142, 144 of the light extraction bridge 140 before escaping into the air. The light extraction bridge 140 keeps photons from reaching the absorbing surfaces 122, for example, the solder, wire bond, submounts and die. As shown in FIG. 1C, light extraction bridge 140 is comprised of two elements, horizontal element 146 and vertical element 148. The light extraction bridge 140 is formed at an upper portion 150 of cup 116.

The light extraction bridge 140 adds an additional shallow, wide cup shape that may be superimposed on top of a standard cup. Similarly, the light extraction bridge 140 may be formed on, within or as a component of a cup. There may be several of these shallow, wide cup shapes superimposed on top of a standard cup. The reflective film may be a dichroic coating tuned to the LED die emission. A masking process may be used to ensure that that the electrodes are not coated with reflective material 118 or the alternative dichroic coating.

Figure 1D:
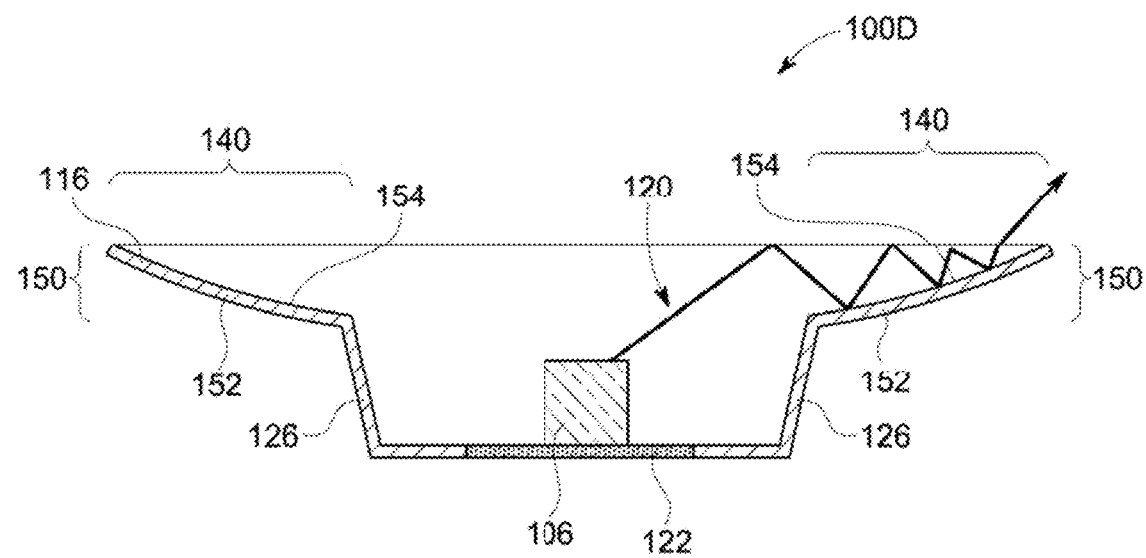
FIG. 1D is a diagram showing a cup having a light extraction bridge with curvature.

FIG. 1D is a diagram 100D showing a cup 116 having a light refraction bridge 140 with curved portion 152 which may be a parabola in shape. As shown in FIG. 1D, light extraction bridge 140 is formed of a curved portion 152 which is coated with a reflective material 154. The curved portion 152 may be located above wall 126 at upper portion 150. Light extraction bridge 140 may provide a means for light ray 120 to exit cup 116 without being absorbed by surfaces 122 or LED die 106. Light extraction bridge 140 is formed at upper portion 150 of cup 116 which is located above cup wall 126.

Figure 1E:
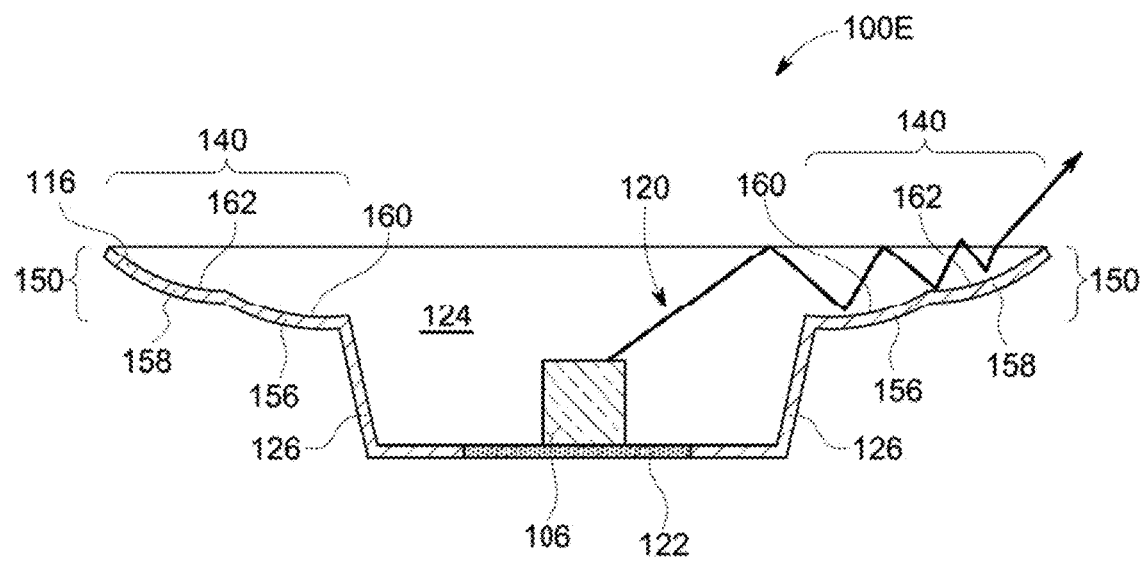
FIG. 1E is a diagram of a cup having a light extraction bridge with additional curvatures.

FIG. 1E is a diagram 100E of a cup 116 having a light extraction bridge 140 with a plurality of curvatures 156, 158. As shown in FIG. 1E, light extraction bridge 140 is formed of a plurality of curved portions 156, 158 which are coated with a reflective material 160, 162. Reflective material 160, 162 may be comprised of a single reflective material or may be comprised of two or more different materials. The curved portion 152 may provide a means for light ray 120 to exit cup 116 without being absorbed by surfaces 122 or LED die 106. Light ray 120 may be reflected by both reflective material 160, 162 of curvatures 156, 158 or by only one of the two. Light extraction bridge 140 is shown as being formed at upper portion 150 of cup 116 above wall 126. Cavity 124 may or may not be filled with material.

Figure 1F:
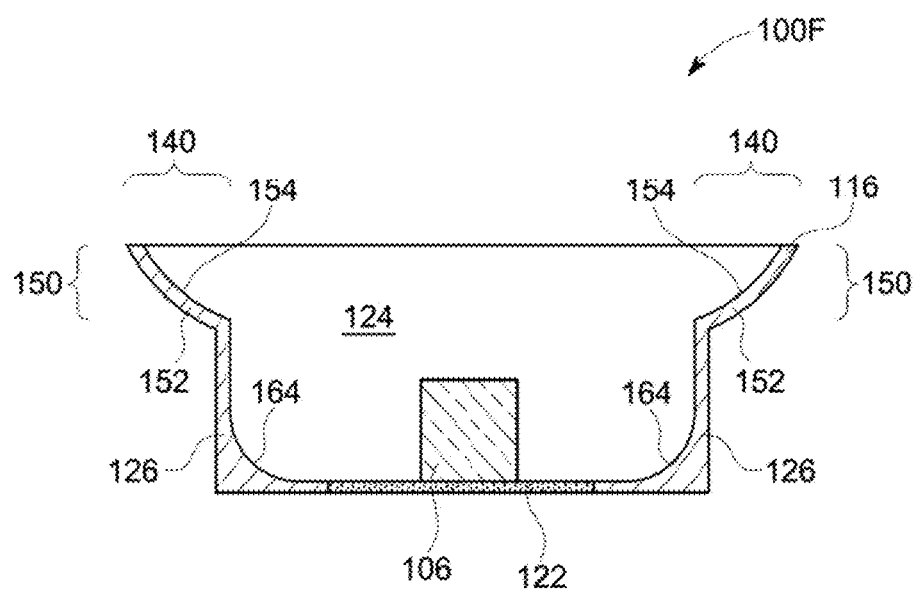
FIG. 1F is a diagram of parabolic cup having a light extraction bridge with curvature.

FIG. 1F is a diagram 100F of parabolic cup 116 having a light extraction bridge with curvature. As shown in FIG. 1F, light extraction bridge 140 is formed of a curved portion 152 which is coated with a reflective material 154 much like FIG. 1D. However, unlike FIG. 1*d*, bottom portion of cup 116 may be a curved internal channel 164 and may form a parabola shape similar to FIG. 1A. Light extraction bridge 140 is formed at upper portion 150 of cup 116 above wall 126. Light extraction bridge 140 of FIG. 1F is shown as slightly narrower than in other FIGs. Light extraction bridge 140 may be made narrower or longer as required. The cup 116 of FIG. 1F includes a curved interior section 164 which may be shaped to form a parabola as seen in more detail with respect to FIG. 1A. Curved interior channel 164 may take other forms as well.

Figure 1G:
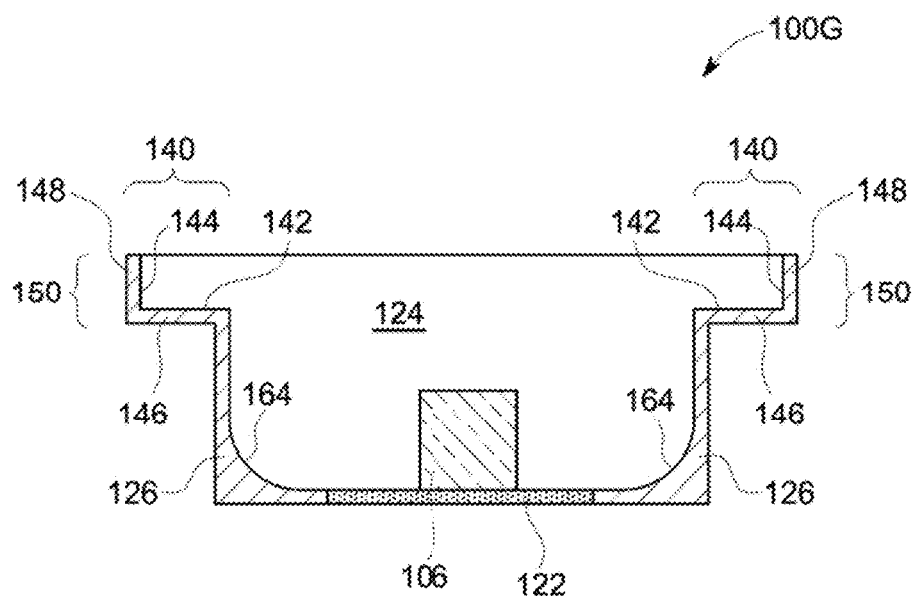
FIG. 1G is a diagram of parabolic cup having a light extraction bridge without curvature.

FIG. 1G is a diagram 100G of parabolic cup 116 having a light extraction bridge 140 without curvature. As shown in FIG. 1G, light extraction bridge 140 may be formed at an upper portion 150 of cup 116 above wall 126. Bottom portion of cup 116 may be curved internal channel 164 on the inside of wall 126 to allow for an alternative propogation of a light ray. This curvature of wall 126 may aid in more light rays reaching the air and/or light extraction bridge 140 at portion 150 above.

Figure 1H:
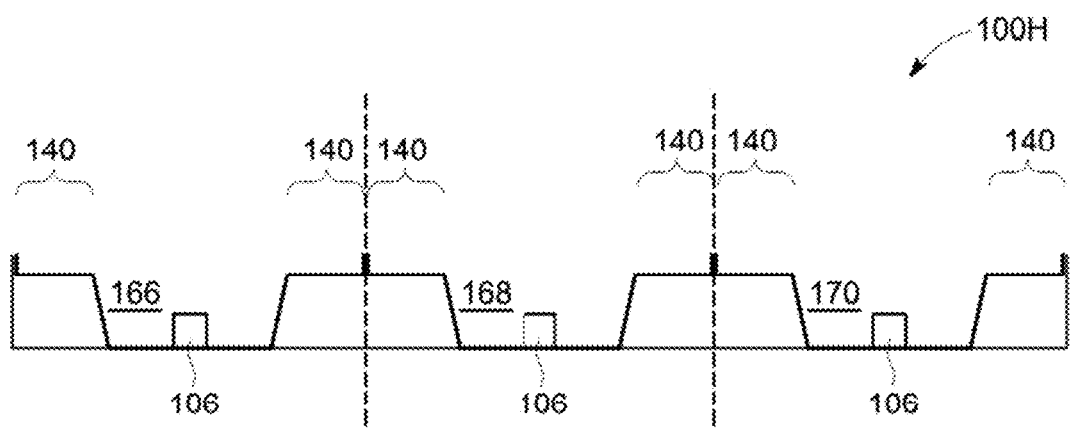
FIG. 1H is a diagram of a plurality of cups having light extraction bridges.

FIG. 1H is a diagram of a cross section 100H of a plurality of cups 166, 168, 170 each having a light extraction bridge 140. Each one of cups 166, 168, 170 may be formed together and then cut individually along dashed lines as shown. Cutting each one of the plurality of cups 166, 168, 170 may separate them out into individual packages. Each one of cups 166, 168, 170 have an LED die 106 as well as other absorbing surfaces (not shown).

Figure 1I:
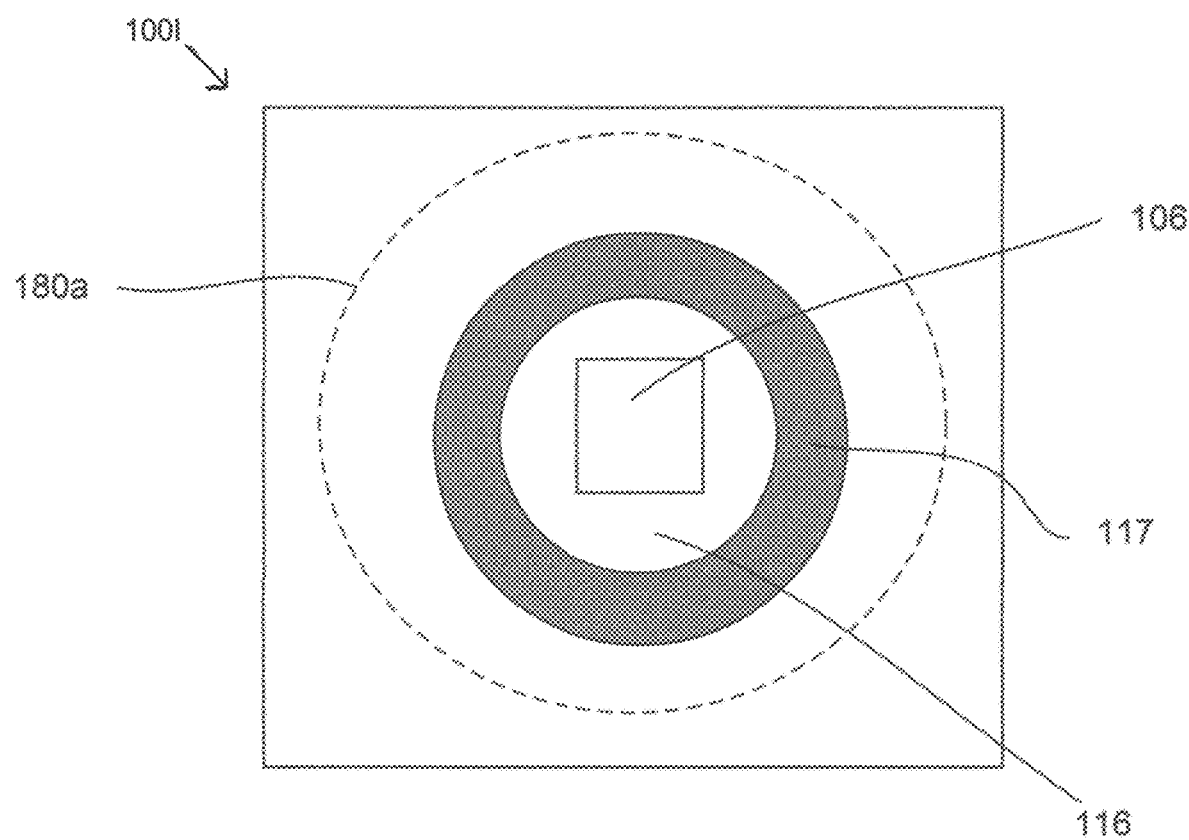
FIG. 1I is a diagram showing a cup with cavities.

FIG. 1I is a diagram 100I showing a top view of a cup 116 having a light extraction bridge 117. Having a light extraction bridge feature clearly increases light output 180*a* from cup 116 emitted by led die 106, as shown in comparison to FIG. 1J, as described below which may be wire bonded.

Figure 1J:
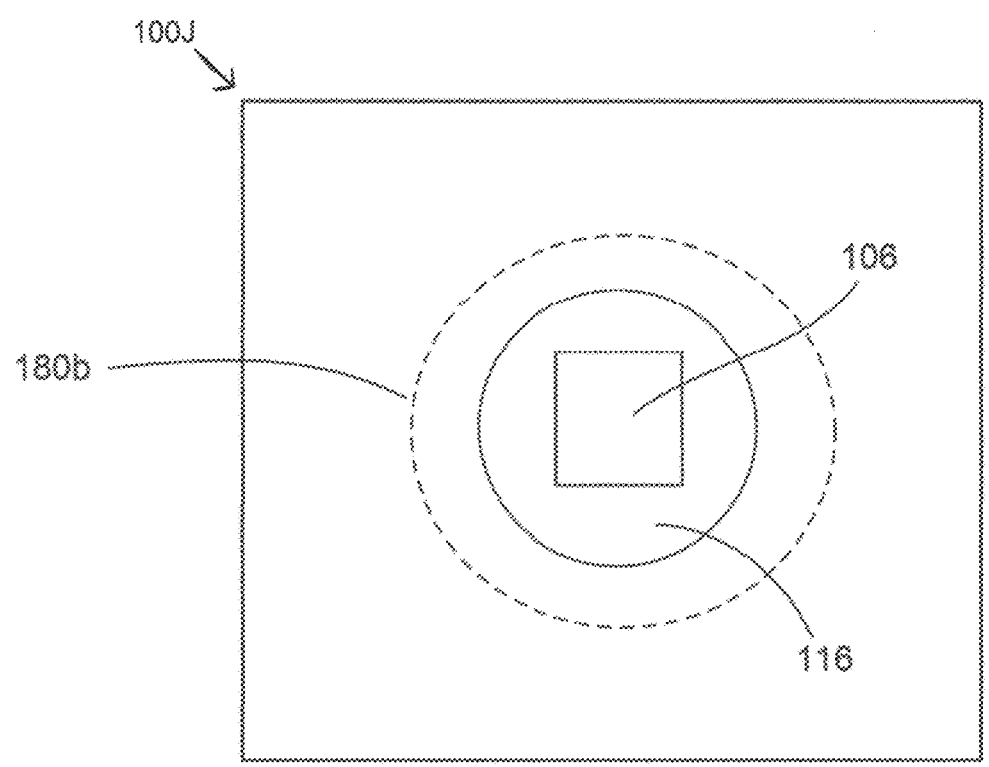
FIG. 1J is a diagram showing a cup without cavities.
Figure 1K:
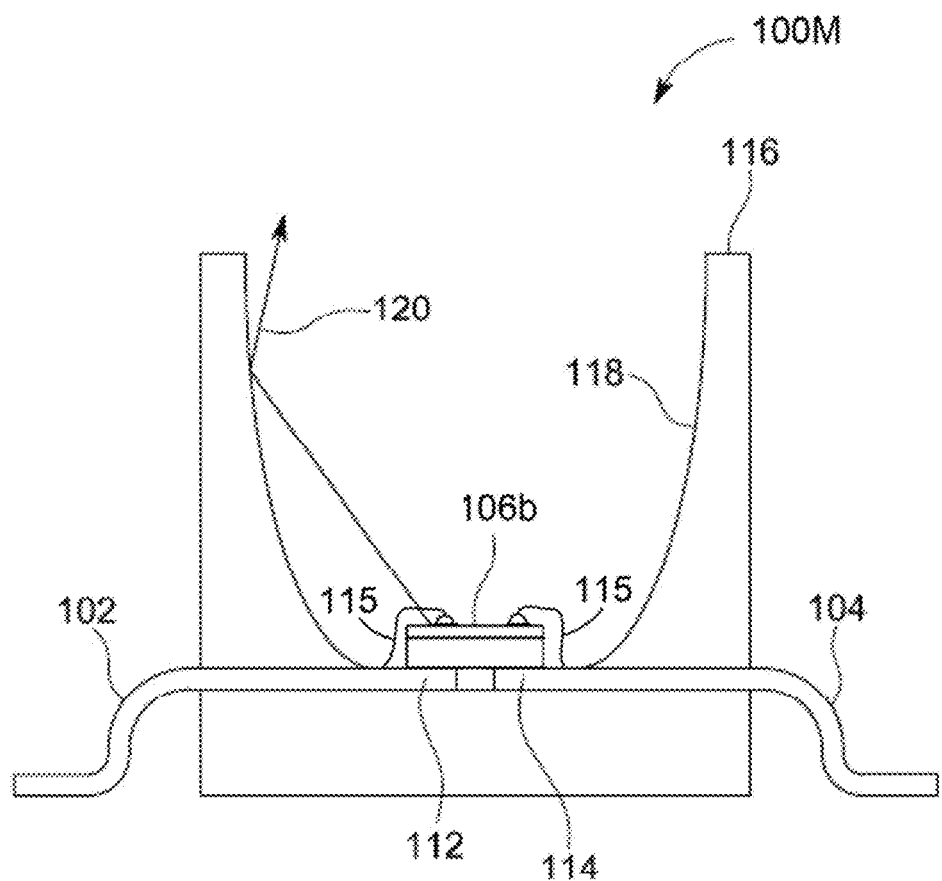
FIG. 1K is a diagram showing a reflective cup package with wire bonds.

FIG. 1J is a diagram 100J showing a cup without a light extraction bridge feature. In FIG. 1J, light output 180*b* is lower than (narrower than as shown) as compared to FIG. 1I. Light output 180*b* is produced by led die 106 which may be wire bonded.

Simulation results have indicated a better than 3% gain with a light extraction bridge. Simulations and experiments have shown that this feature can increase the light extraction by >3% (e.g., 3.5% gain). For example, for a given die, the amount of light loss without a light extraction bridge may be −2.1% whereas the gain achieved from adding the light extraction bridge is 3.45%.

Figure 1L:
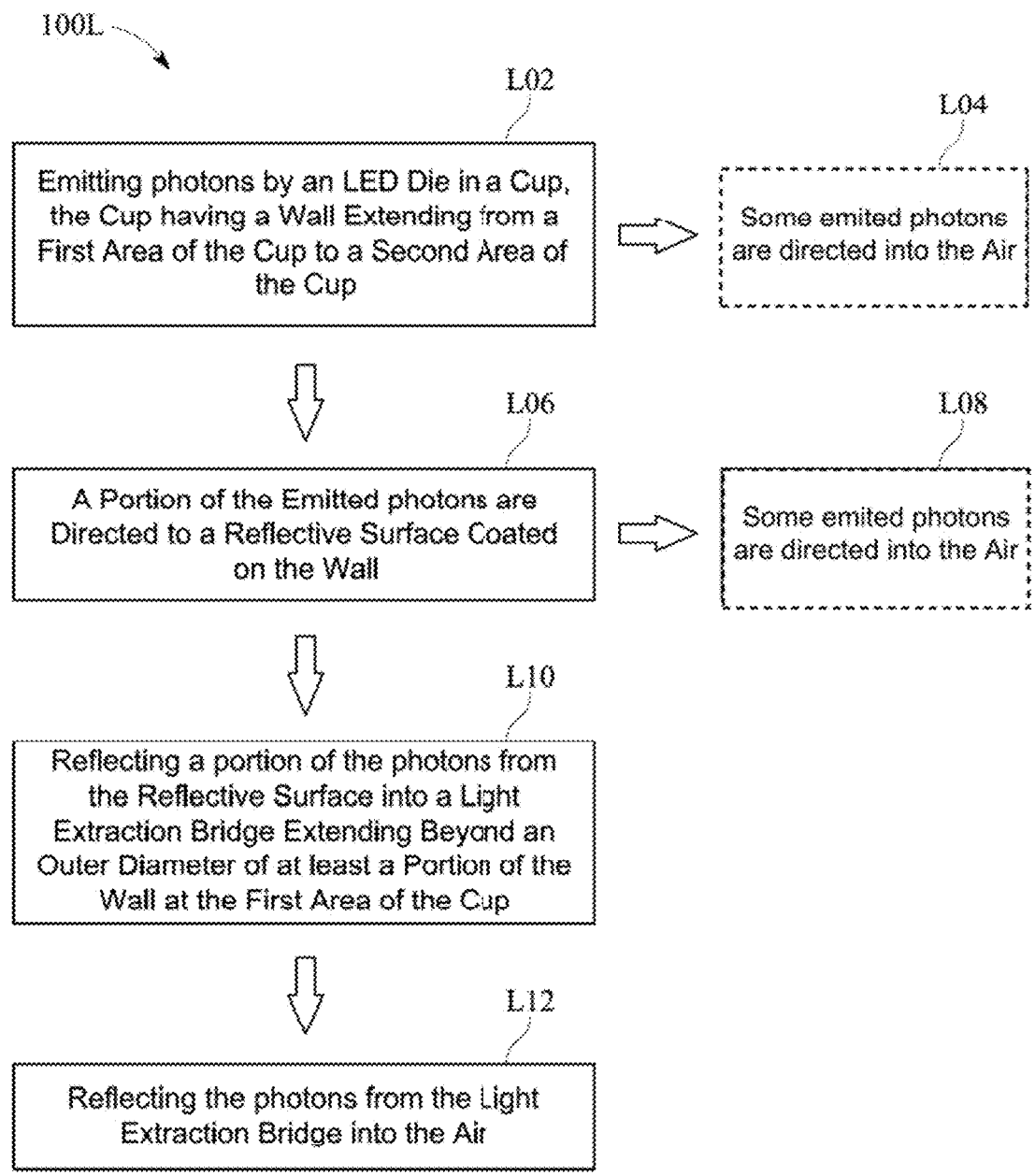
FIG. 1L is a flowchart showing an exemplary method for emitting photons from a light extraction bridge into the air.

FIG. 1L is a flowchart 100L showing an example method for emitting photons from a light extraction bridge into the air. The method may comprise emitting photons L02 by a a light emitting diode (LED) die in a cup having a wall extending from a first area of the cup to a second area of the cup. Some of the emitted photons may be directed L04 into the air. Emitted photons are directed L06 to a reflective surface coated on the wall. Again, some emitted photons may be directed L08 and released into the air. The method may further comprise reflecting L10 a portion of the photons from the reflective surface into a light extraction bridge extending beyond an outer diameter of at least a portion of the wall at the first area of the cup. The photons from the light extraction bridge may then be reflected L12 into air.

It will be understood that although one or more shapes are described and/or shown in FIGS. 1A-1K, such as the shape of cups and/or light extraction bridges, that other shapes may be applicable under the subject matter disclosed herein. The shapes may be different in angle, design, configuration, size, curvature, and/or any other applicable attribute.

Embodiments described herein may be implemented using a cup mold to shape the cup. The embodiments described herein may be applied to any other design or embodiment which uses a cup shape. A light extraction bridge may also be referred to as a gap. The light extraction bridge is shown in the drawings as being on both sides of cup outer wall. However, in some embodiments, light extraction bridge may only be formed on a portion of the cup, i.e. only on one side and/or not totally surrounding of the cup.

Figure 2A:
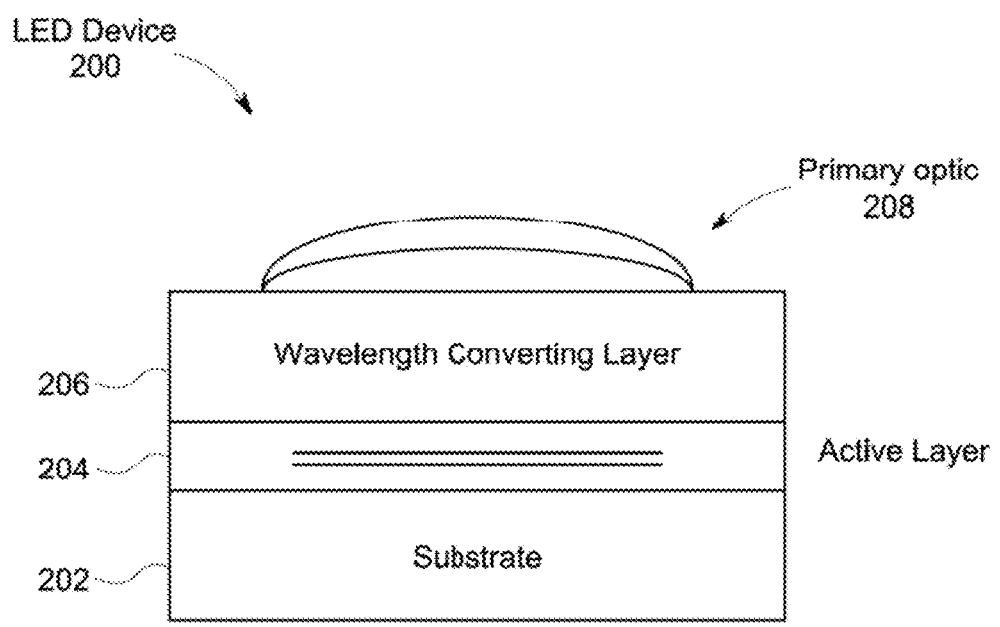
FIG. 2A is a diagram showing an Light Emitting Diode (LED) device.

FIG. 2A is a diagram of an LED device 200 in an example embodiment. The LED device 200 may include a substrate 202, an active layer 204, a wavelength converting layer 206, and primary optic 208. In other embodiments, an LED device may not include a wavelength converter layer and/or primary optics. For example, the reflective cup package 100A of FIG. 1A may be implemented without a wavelength converting layer and/or primary optics such that the reflective cup package 100A is a direct emitter. Device 200 may be implemented using a cup, as provided in FIGS. 1A-J and may be operated as disclosed in FIG. 1L.

As shown in FIG. 2A, the active layer 204 may be adjacent to the substrate 202 and emits light when excited. Suitable materials used to form the substrate 202 and the active layer 204 include sapphire, SiC, GaN, Silicone and may more specifically be formed from a III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof.

The wavelength converting layer 206 may be remote from, proximal to, or directly above active layer 204. The active layer 204 emits light into the wavelength converting layer 206. The wavelength converting layer 206 acts to further modify wavelength of the emitted light by the active layer 204. LED devices that include a wavelength converting layer are often referred to as phosphor converted LEDs ("PCLED"). The wavelength converting layer 206 may include any luminescent material, such as, for example, phosphor particles in a transparent or translucent binder or matrix, or a ceramic phosphor element, which absorbs light of one wavelength and emits light of a different wavelength.

The primary optic 208 may be on or over one or more layers of the LED device 200 and allow light to pass from the active layer 204 and/or the wavelength converting layer 206 through the primary optic 208. The primary optic 208 may be a lens or encapsulate configured to protect the one or more layers and to, at least in part, shape the output of the LED device 200. Primary optic 208 may include transparent and/or semi-transparent material. In example embodiments, light via the primary optic may be emitted based on a Lambertian distribution pattern. It will be understood that one or more properties of the primary optic 208 may be modified to produce a light distribution pattern that is different than the Lambertian distribution pattern. As disclosed herein, primary optic 208 may not be included in one or more embodiments disclosed herein.

Figure 2B:
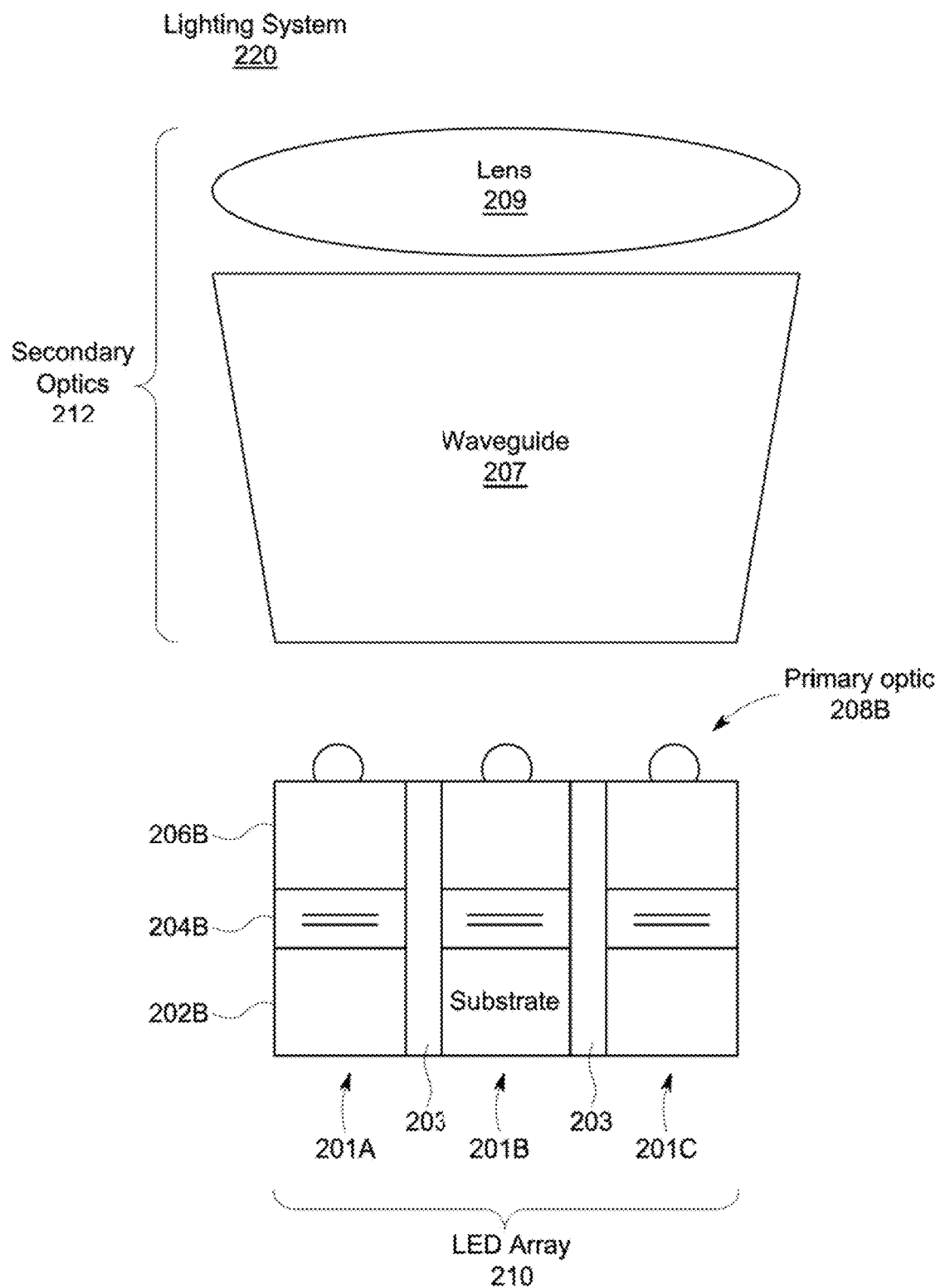
FIG. 2B is a diagram showing an LED system with secondary optics.

FIG. 2B shows a cross-sectional view of a lighting system 220 including an LED array 210 with pixels 201A, 201B, and 201C, as well as secondary optics 212 in an example embodiment. The LED array 210 includes pixels 201A, 201B, and 201C each including a respective wavelength converting layer 206B active layer 204B and a substrate 202B. The LED array 210 may be a monolithic LED array manufactured using wafer level processing techniques, a micro LED with sub-500 micron dimensions, or the like. Pixels 201A, 201B, and 201C, in the LED array 210 may be formed using array segmentation, or alternatively using pick and place techniques. Pixels 201A, 201B, and/or 201C may be implemented using a cup, as provided in FIGS. 1A-J and may be operated as disclosed in FIG. 1L.

The spaces 203 shown between one or more pixels 201A, 201B, and 201C of the LED devices 200B may include an air gap or may be filled by a material such as a metal material which may be a contact (e.g., n-contact).

The secondary optics 212 may include one or both of the lens 209 and waveguide 207. It will be understood that although secondary optics are discussed in accordance with the example shown, in example embodiments, the secondary optics 212 may be used to spread the incoming light (diverging optics), or to gather incoming light into a collimated beam (collimating optics). In example embodiments, the waveguide 207 may be a concentrator and may have any applicable shape to concentrate light such as a parabolic shape, cone shape, beveled shape, or the like. The waveguide 207 may be coated with a dielectric material, a metallization layer, or the like used to reflect or redirect incident light. In alternative embodiments, a lighting system may not include one or more of the following: the wavelength converting layer 206B, the primary optics 208B, the waveguide 207 and the lens 209.

Lens 209 may be formed form any applicable transparent material such as, but not limited to SiC, aluminum oxide, diamond, or the like or a combination thereof. Lens 209 may be used to modify the a beam of light input into the lens 209 such that an output beam from the lens 209 will efficiently meet a desired photometric specification. Additionally, lens 209 may serve one or more aesthetic purpose, such as by determining a lit and/or unlit appearance of the p 201A, 201B and/or 201C of the LED array 210.

Figure 3:
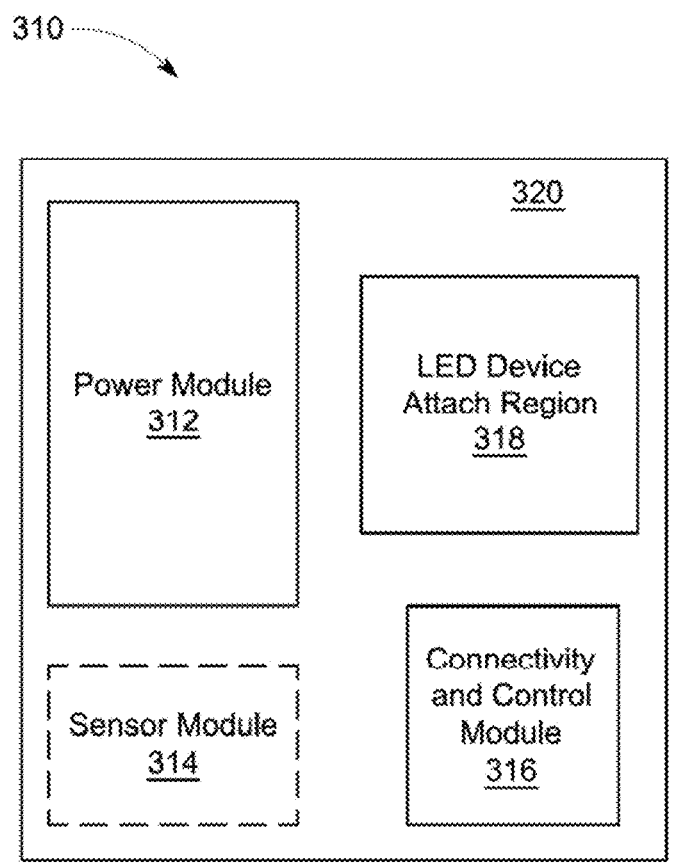
FIG. 3 is a top view of an electronics board for an integrated LED lighting system according to one embodiment.

FIG. 3 is a top view of an electronics board 310 for an integrated LED lighting system according to one embodiment. In alternative embodiments, two or more electronics boards may be used for the LED lighting system. For example, the LED array may be on a separate electronics board, or the sensor module may be on a separate electronics board. In the illustrated example, the electronics board 310 includes a power module 312, a sensor module 314, a connectivity and control module 316 and an LED attach region 318 reserved for attachment of an LED array to a substrate 320.

The substrate 320 may be any board capable of mechanically supporting, and providing electrical coupling to, electrical components, electronic components and/or electronic modules using conductive connecters, such as tracks, traces, pads, vias, and/or wires. The power module 312 may include electrical and/or electronic elements. In an example embodiment, the power module 312 includes an AC/DC conversion circuit, a DC/DC conversion circuit, a dimming circuit, and an LED driver circuit.

The sensor module 314 may include sensors needed for an application in which the LED array is to be implemented.

The connectivity and control module 316 may include the system microcontroller and any type of wired or wireless module configured to receive a control input from an external device.

The term module, as used herein, may refer to electrical and/or electronic components disposed on individual circuit boards that may be soldered to one or more electronics boards 310. The term module may, however, also refer to electrical and/or electronic components that provide similar functionality, but which may be individually soldered to one or more circuit boards in a same region or in different regions.

Figure 4A:
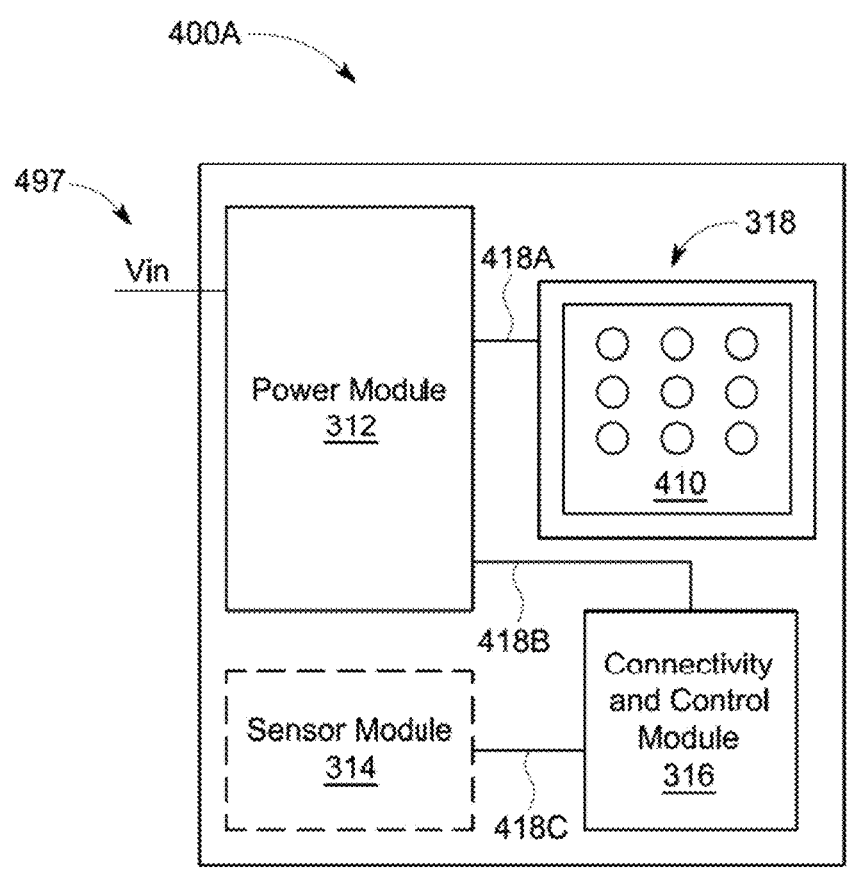
FIG. 4A is a top view of the electronics board with LED array attached to the substrate at the LED device attach region in one embodiment.

FIG. 4A is a top view of the electronics board 310 with an LED array 410 attached to the substrate 320 at the LED device attach region 318 in one embodiment. The electronics board 310 together with the LED array 410 represents an LED system 400A. Additionally, the power module 312 receives a voltage input at Vin 497 and control signals from the connectivity and control module 316 over traces 418B, and provides drive signals to the LED array 410 over traces 418A. The LED array 410 is turned on and off via the drive signals from the power module 312. In the embodiment shown in FIG. 4A, the connectivity and control module 316 receives sensor signals from the sensor module 314 over trace 418C.

Figure 4B:
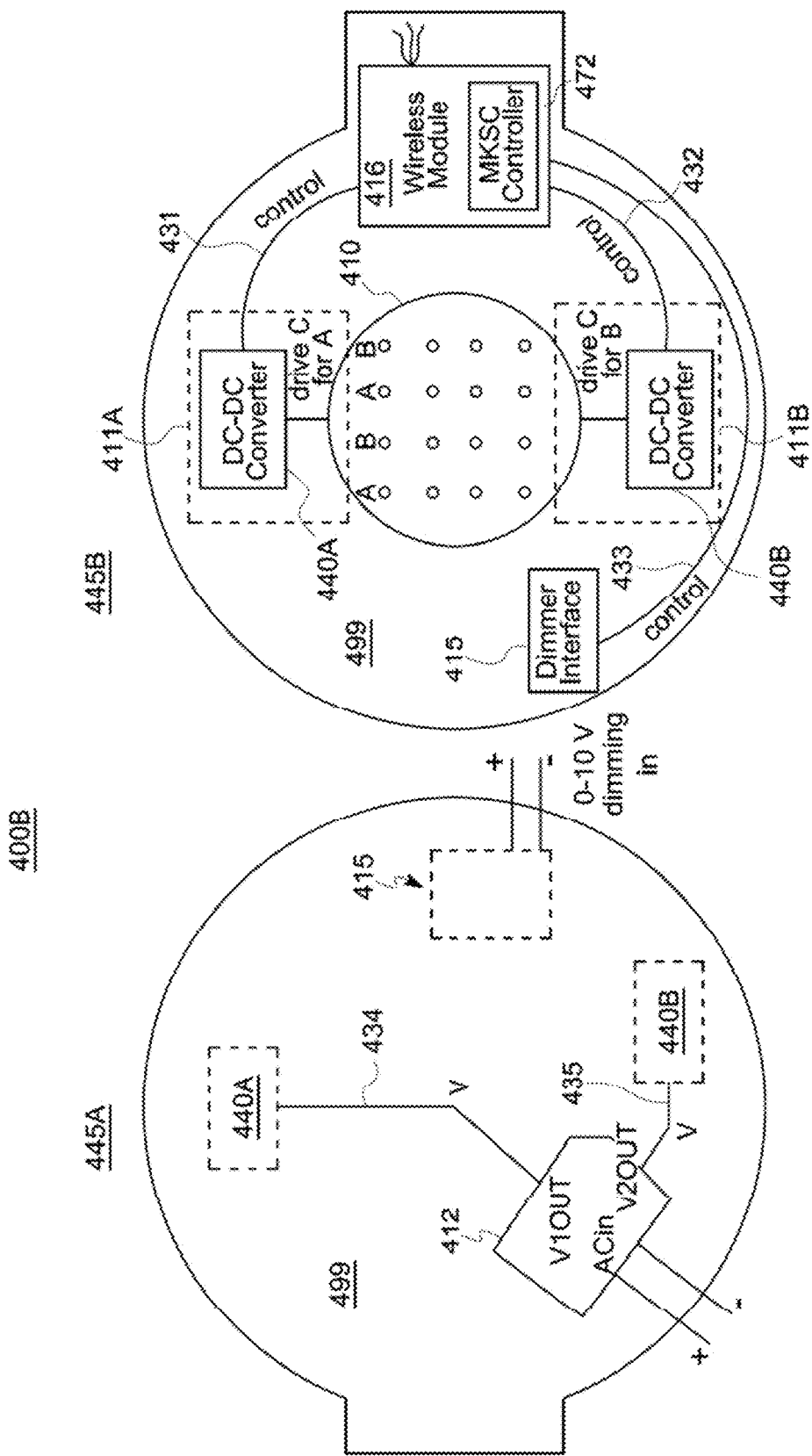
FIG. 4B is a diagram of one embodiment of a two channel integrated LED lighting system with electronic components mounted on two surfaces of a circuit board.

FIG. 4B illustrates one embodiment of a two channel integrated LED lighting system with electronic components mounted on two surfaces of a circuit board 499. As shown in FIG. 4B, an LED lighting system 400B includes a first surface 445A having inputs to receive dimmer signals and AC power signals and an AC/DC converter circuit 412 mounted on it. The LED system 400B includes a second surface 445B with the dimmer interface circuit 415, DC-DC converter circuits 440A and 440B, a connectivity and control module 416 (a wireless module in this example) having a microcontroller 472, and an LED array 410 mounted on it. The LED array 410 is driven by two independent single channels 411A and 411B. In alternative embodiments, a single channel may be used to provide the drive signals to an LED array, or any number of multiple channels may be used to provide the drive signals to an LED array.

The LED array 410 may include two groups of LED devices. In an example embodiment, the LED devices of group A are electrically coupled to a first channel 411A and the LED devices of group B are electrically coupled to a second single channel 411B. Each of the two DC-DC converters 440A and 440B may provide a respective drive current via single channels 411A and 411B, respectively, for driving a respective group of LEDs A and B in the LED array 410. The LEDs in one of the groups of LEDs may be configured to emit light having a different color point than the LEDs in the second group of LEDs. Control of the composite color point of light emitted by the LED array 410 may be tuned within a range by controlling the current and/or duty cycle applied by the individual DC/DC converter circuits 440A and 440B via a single channel 411A and 411B, respectively. Although the embodiment shown in FIG. 4B does not include a sensor module (as described in FIG. 3 and FIG. 4A), an alternative embodiment may include a sensor module.

The illustrated LED lighting system 400B is an integrated system in which the LED array 410 and the circuitry for operating the LED array 410 are provided on a single electronics board. Connections between modules on the same surface of the circuit board 499 may be electrically coupled for exchanging, for example, voltages, currents, and control signals between modules, by surface or sub-surface interconnections, such as traces 431, 432, 433, 434 and 435 or metallizations (not shown). Connections between modules on opposite surfaces of the circuit board 499 may be electrically coupled by through board interconnections, such as vias and metallizations (not shown).

According to embodiments, LED systems may be provided where an LED array is on a separate electronics board from the driver and control circuitry. According to other embodiments, a LED system may have the LED array together with some of the electronics on an electronics board separate from the driver circuit. For example, an LED system may include a power conversion module and an LED module located on a separate electronics board than the LED arrays.

According to embodiments, an LED system may include a multi-channel LED driver circuit. For example, an LED module may include embedded LED calibration and setting data and, for example, three groups of LEDs. One of ordinary skill in the art will recognize that any number of groups of LEDs may be used consistent with one or more applications. Individual LEDs within each group may be arranged in series or in parallel and the light having different color points may be provided. For example, warm white light may be provided by a first group of LEDs, a cool white light may be provided by a second group of LEDs, and a neutral white light may be provided by a third group.

Figure 5:
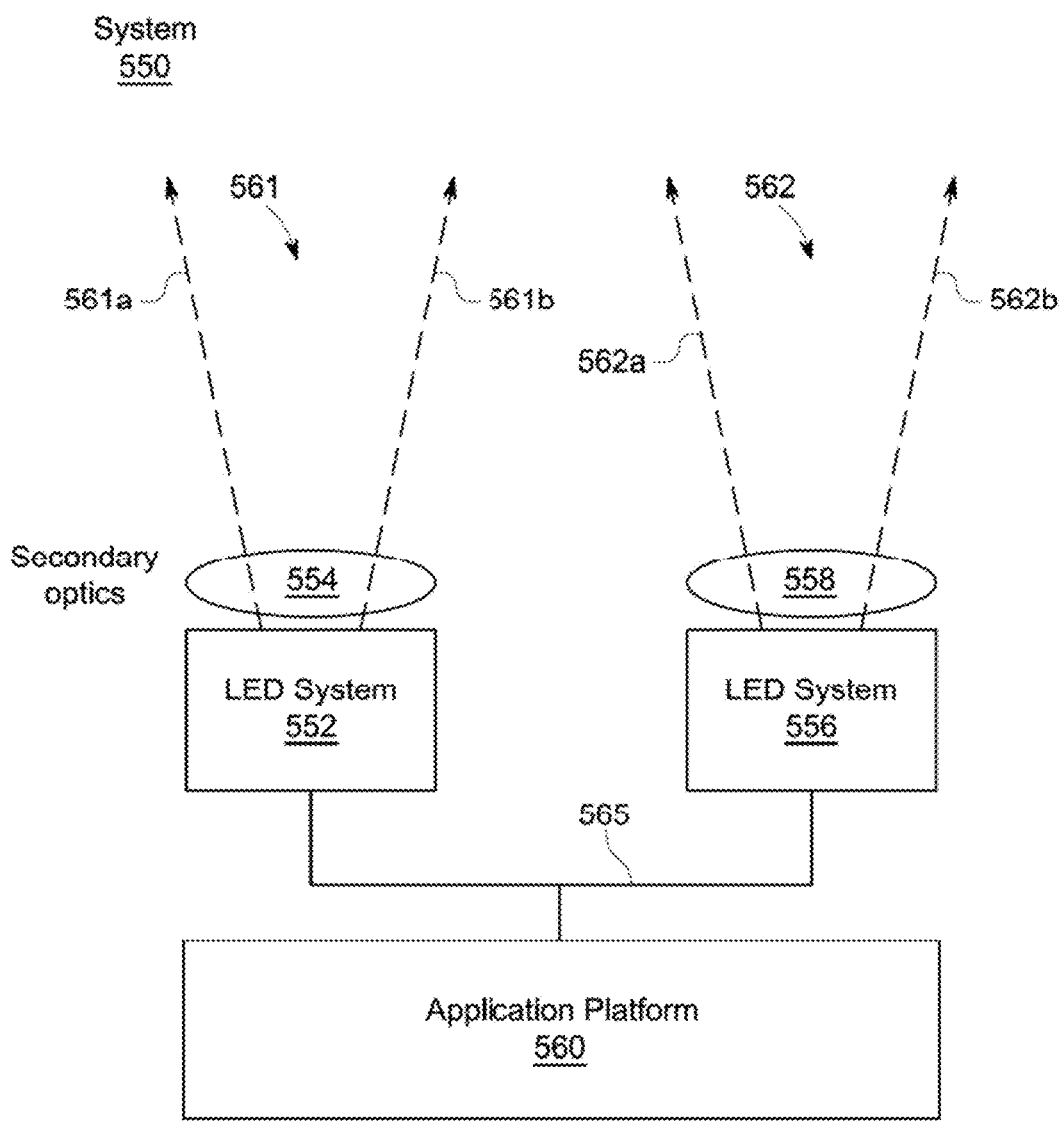
FIG. 5 is a diagram of an example application system.

FIG. 5 shows an example system 550 which includes an application platform 560, LED systems 552 and 556, and secondary optics 554 and 558. The LED System 552 produces light beams 561 shown between arrows 561*a* and 561*b*. The LED System 556 may produce light beams 562 between arrows 562*a* and 562*b*. In the embodiment shown in FIG. 5, the light emitted from LED system 552 passes through secondary optics 554, and the light emitted from the LED System 556 passes through secondary optics 558. In alternative embodiments, the light beams 561 and 562 do not pass through any secondary optics. The secondary optics may be or may include one or more light guides. The one or more light guides may be edge lit or may have an interior opening that defines an interior edge of the light guide. LED systems 552 and/or 556 may be inserted in the interior openings of the one or more light guides such that they inject light into the interior edge (interior opening light guide) or exterior edge (edge lit light guide) of the one or more light guides. LEDs in LED systems 552 and/or 556 may be arranged around the circumference of a base that is part of the light guide. According to an implementation, the base may be thermally conductive. According to an implementation, the base may be coupled to a heat-dissipating element that is disposed over the light guide. The heat-dissipating element may be arranged to receive heat generated by the LEDs via the thermally conductive base and dissipate the received heat. The one or more light guides may allow light emitted by LED systems 552 and 556 to be shaped in a desired manner such as, for example, with a gradient, a chamfered distribution, a narrow distribution, a wide distribution, an angular distribution, or the like.

In example embodiments, the system 550 may be a mobile phone of a camera flash system, indoor residential or commercial lighting, outdoor light such as street lighting, an automobile, a medical device, AR/VR devices, and robotic devices. The integrated LED lighting system shown in FIG. 3, LED System 400A shown in FIG. 4A, illustrate LED systems 552 and 556 in example embodiments.

In example embodiments, the system 550 may be a mobile phone of a camera flash system, indoor residential or commercial lighting, outdoor light such as street lighting, an automobile, a medical device, AR/VR devices, and robotic devices. The LED System 400A shown in FIG. 4A and LED System 400B shown in FIG. 4B illustrate LED systems 552 and 556 in example embodiments.

The application platform 560 may provide power to the LED systems 552 and/or 556 via a power bus via line 565 or other applicable input, as discussed herein. Further, application platform 560 may provide input signals via line 565 for the operation of the LED system 552 and LED system 556, which input may be based on a user input/preference, a sensed reading, a pre-programmed or autonomously determined output, or the like. One or more sensors may be internal or external to the housing of the application platform 560.

In various embodiments, application platform 560 sensors and/or LED system 552 and/or 556 sensors may collect data such as visual data (e.g., LIDAR data, IR data, data collected via a camera, etc.), audio data, distance based data, movement data, environmental data, or the like or a combination thereof. The data may be related a physical item or entity such as an object, an individual, a vehicle, etc. For example, sensing equipment may collect object proximity data for an ADAS/AV based application, which may prioritize the detection and subsequent action based on the detection of a physical item or entity. The data may be collected based on emitting an optical signal by, for example, LED system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a vertical-cavity surface-emitting laser (VCSEL). The one or more sensors may sense a response to the emitted beam or any other applicable input.

In example embodiment, application platform 560 may represent an automobile and LED system 552 and LED system 556 may represent automobile headlights. In various embodiments, the system 550 may represent an automobile with steerable light beams where LEDs may be selectively activated to provide steerable light. For example, an array of LEDs may be used to define or project a shape or pattern or illuminate only selected sections of a roadway. In an example embodiment, Infrared cameras or detector pixels within LED systems 552 and/or 556 may be sensors that identify portions of a scene (roadway, pedestrian crossing, etc.) that require illumination.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A light emitting device comprising:
   a cup having a wall extending from a first area of the cup to a second area of the cup, such that the wall is formed from or coated with a reflective material, the cup including a base and a curved internal channel in corners of the base forming a parabola facing away from the base;
   a light extraction bridge extending outside a perimeter of the wall, the light extraction bridge including a first reflective portion and a second reflective portion, the first reflective portion generally parallel to the base and the second reflective portion extending from the first reflective portion and away from the base; and
   a light emitting diode (LED) die mounted at the second area of the cup such that a portion of light emitted from the LED die exits the cup via the light extraction bridge.

2. The light emitting device of claim 1, wherein the first reflective portion is generally perpendicular to the second reflective portion.

3. The light emitting device of claim 1, further comprising a material at least partially filling the light extraction bridge.

4. The light emitting device of claim 1, wherein the material further at least partially fills the cup.

5. The light emitting device of claim 3, wherein the material is clear or includes a phosphor mixture.

6. The light emitting device of claim 1, wherein the first reflective portion and the second reflective portion are coated with the reflective material.

7. The light emitting device of claim 6, wherein the reflective material includes silver or aluminum.

8. A light emitting device comprising:
   a cup having a wall extending from a first area of the cup to a second area of the cup, such that the wall is formed from or coated with a reflective material, the cup including a base;
   a light extraction bridge extending outside a perimeter of the wall, the light extraction bridge including a first curved reflective portion that extends away from the wall and the base and a second curved reflective portion that extends away from the first curved reflective portion and the base, the first curved reflective portion extending between the wall and the second curved reflective portion, a first end of the curved reflective portion and a first end of the second curved reflective portion meet to form a peak; and
   a light emitting diode (LED) die mounted at the second area of the cup such that a portion of light emitted from the LED die exits the cup via the light extraction bridge.

9. The light emitting device of claim 8, further comprising an encapsulant at least partially filling the light extraction bridge.

10. The light emitting device of claim 9, wherein the encapsulant further at least partially fills the cup.

11. The light emitting device of claim 9, wherein the encapsulant is clear or includes a phosphor mixture.

12. The light emitting device of claim 8, wherein the first curved reflective portion and the second curved reflective portion are coated with the reflective material and configured to reflect the light away from the base.

13. The light emitting device of claim 12, wherein the reflective material includes silver or aluminum.

14. The light emitting device of claim 8, wherein the wall extends beyond a surface of the LED die facing away from the base.

15. A method of operating a light emitting device, the method comprising:
    emitting photons by a light emitting diode (LED) in a cup having a wall extending from a first area of the cup to a second area of the cup, wherein the emitted photons are directed to a reflective material coated on the wall;
    reflecting the photons from the reflective material and a curved internal channel in corners of a base of the cup into a light extraction bridge extending beyond a perimeter of at least a portion of the wall at the first area of the cup, the light extraction bridge including a first reflective portion generally parallel to a base of the cup and a second reflective portion extending from the first reflective portion and away from the base, the curved internal channel forming a parabola facing away from the base; and
    reflecting the photons from the first and second reflective portions of the light extraction bridge into air.

16. The method of claim 15, wherein the first reflective portion is generally perpendicular to the second reflective portion.

17. The method of claim 15, further comprising emitting the photons through an encapsulant at least partially filling the light extraction bridge.

18. The method of claim 17, wherein the encapsulant further at least partially fills the cup.

19. The method of claim 15, wherein the encapsulant is clear or includes a phosphor mixture.

20. The method of claim 15, wherein the first reflective portion and the second reflective portion are coated with the reflective material.

21. A light emitting device comprising:
    a cup having a wall extending from a first area of the cup to a second area of the cup, such that the wall is formed from or coated with a reflective material, the cup including a base and a curved internal channel in corners of the base forming a parabola facing away from the base;
    a light extraction bridge extending outside a perimeter of the wall, the light extraction bridge including a reflective portion extending away from the base; and
    a light emitting diode (LED) die mounted at the second area of the cup such that a portion of light emitted from the LED die exits the cup via the light extraction bridge.

22. The light emitting device of claim 21, wherein the reflective portion includes one or more curved portions.

23. The light emitting device of claim 21, wherein the reflective portion includes one or more straight portions.

* * * * *

UNITED STATES PATENT AND TRADEMARK OFFICE
CERTIFICATE OF CORRECTION

| | | |
|---|---|---|
| PATENT NO. | : 11,092,311 B2 | Page 1 of 1 |
| APPLICATION NO. | : 16/815706 | |
| DATED | : August 17, 2021 | |
| INVENTOR(S) | : Shen et al. | |

It is certified that error appears in the above-identified patent and that said Letters Patent is hereby corrected as shown below:

On the Title Page

In Column 1, under "Related U.S. Application Data", Line 2, after "2019.", insert
--(30) Foreign Application Priority Data
Apr. 4, 2019 (EP) 19167369--

In the Claims

In Column 11, Line 34, in Claim 4, delete "claim 1," and insert --claim 3,-- therefor In Column 11, Line 55, in Claim 8, before "curved", insert --first--

Signed and Sealed this
Ninth Day of November, 2021

Drew Hirshfeld
*Performing the Functions and Duties of the*
*Under Secretary of Commerce for Intellectual Property and*
*Director of the United States Patent and Trademark Office*